United States Patent [15] 3,691,289
Rohloff [45] Sept. 12, 1972

[54] PACKAGING OF SEMICONDUCTOR DEVICES

[72] Inventor: Robert R. Rohloff, Lakeland, Minn.

[73] Assignee: Minnesota Mining and Manufacturing Company, St. Paul, Minn.

[22] Filed: Oct. 22, 1970

[21] Appl. No.: 82,872

[52] U.S. Cl.....................174/52 PE, 29/588, 29/627, 174/DIG. 3, 317/101 CP, 317/234 E, 206/65 F

[51] Int. Cl...............................................H05k 5/00

[58] Field of Search...174/52 PE, 52 S, 68.5, DIG. 3; 317/101 A, 101 CP, 101 CC, 234 E, 234 G, 234 H; 29/625–627, 588, 589; 206/65 F

[56] References Cited

UNITED STATES PATENTS 3,440,027 4/1969 Hugle.....................174/52 PE
3,271,507 9/1966 Elliott....................174/52 PE

*Primary Examiner*—Darrell L. Clay
*Attorney*—Kinney, Alexander, Sell, Steldt & Delahunt

[57] ABSTRACT

A packaging device is provided for the housing of semiconductor devices to facilitate handling, testing and later attachment thereof to further electrical circuitry. The packaging device comprises a self-supporting dielectric substrate in the form of a channel and a plurality of conductive land areas on the inner surfaces of the channel. The land areas define at least one site within the channel which is adapted to electrically receive a semiconductor device. The land areas extend outward from said site in the form of fingers, the fingers extending upwardly along the side walls of the channel so as to be exposed for later attachment thereof to further electrical circuitry.

8 Claims, 9 Drawing Figures

INVENTOR.
ROBERT R. ROHLOFF
BY Kinney, Alexander,
Sell, Steldt & De La Hunt
ATTORNEYS INVENTOR.
ROBERT R. ROHLOFF
BY Kinney, Alexander, Sell, Steldt & De La Hunt
ATTORNEYS

PACKAGING OF SEMICONDUCTOR DEVICES

This invention relates to the packaging of semiconductor devices, and more specifically, to an inexpensive packaging device which houses the semiconductor device and also provides means for connection to further circuitry.

BACKGROUND OF THE INVENTION

In the electrical industry, semiconductor devices, e.g. transistors, integrated circuit chips, etc., are often permanently attached to the desired electrical circuitry by first connecting the miniature semiconductor device to a device known as a lead header or a lead frame and then permanently attaching the lead header or lead frame to the desired circuit. It is common to use a separate bridging conductor such as a spider pattern or wires to connect the semiconductor to the frame or header. After the semiconductor device has been so connected to the lead frame or header, it may be tested to determine whether it possesses the requisite electrical characteristics. Additionally, it is very desirable to hermetically seal, e.g., encapsulate with a resin, or otherwise package the miniature semiconductor device and an area encompassing the converging ends of the lead frame so that the device is protected from environmental moisture and physical abuse which may affect its electrical properties. The so-called encapsulation of the semiconductor device is usually done in a controlled-humidity atmosphere after the device has been bonded to a lead frame but before the lead frame is attached to further electrical circuitry.

Various types of lead frames, lead headers and other such devices have heretofore been available for mounting semiconductor devices to printed circuitry. For example, ceramic blocks or plates with metallized patterns thereon are shown and described in U.S. Pat. No. 3,483,308. Other mounting devices are shown and described in U.S. Pat. No. 3,317,287 and British Pat. No. 1,185,857. However, the mounting devices described in those references are not easily encapsulated with resin so as to hermetically seal the semiconductor device. For example, conventional lead frames are often encapsulated or packaged by using expensive and elaborate techniques such as transfer and injection molding or by sealing the lead frame between a ceramic base and cap using glass solder as adhesive. However, even with such techniques, hermetic seals are not always obtained, and these techniques require the use of expensive equipment or materials. The ceramic and glass packages are fragile and high temperature is needed to weld or glass seal them. The transfer or injection molding operations have several disadvantages such as (1) the encapsulant resin contains mold release agents which may chemically interact with the semiconductor device, (2) the mold release agents reduce the adhesion of the resin to the lead frame leads and therefore moisture leakage paths may develop in the package, (3) the wire leads or bonds to the semiconductor device are disturbed due to forced flow of high viscosity encapsulants around the semiconductor, and (4) the semiconductor device must be supported, either by a rigid lead frame or by a rigid support layer.

The present invention provides a novel, inexpensive packaging device capable of housing one or more semiconductor devices and which also has means for connection of the semiconductor devices to further electrical circuitry. The semiconductor devices housed within the packaging device may be encapsulated or otherwise protected from the environment very easily and efficiently without need for specialized equipment. Because the packaging device provides means for connection to further electrical circuitry, the need for a separate rigid lead frame is eliminated. Consequently, the number of bonding steps required in the package is reduced. Also, the method of packaging semiconductor chips using the device of the invention is very efficient because it may be carried on in a completely continuous manner. The novel device also serves as an in-process carrier for the miniature semiconductor devices and protects them from damage and yet allows them to be tested before final packaging.

In accordance with the invention there is provided a packaging device for the housing of semiconductor devices to facilitate handling, testing and later attachment thereof to further electrical circuitry, the device comprising a self-supporting dielectric substrate in the form of a channel having a base and side walls. The substrate has provided on the channel forming surfaces thereof a predetermined pattern of a plurality of conductive land areas, the land areas defining at least one site on the inside surface of the channel which is adapted to electrically receive a semiconductor device. The land areas extend outward from said site in the form of a plurality of fingers, the fingers extending upwardly along the side walls of the channel so as to be exposed for later attachment thereof to further electrical circuitry. Thus, the semiconductor may be bonded, e.g., through flip-chip or wire bonding, to the conductive land areas at the site which is adapted to electrically receive the semiconductor, and then the semiconductor may be covered with suitable encapsulating material by pouring the encapsulant, e.g. liquid or powder, into the channel followed by curing of the encapsulant. Thus, there is no need for expensive transfer or injection molding techniques in the packaging of the semiconductor chip. The fingers of the packaging device remain exposed as leads for attachment to further circuitry, e.g., to a printed circuit board, and, therefore, no separate lead wires are required.

The invention is described in more detail hereinafter with reference to the accompanying drawings wherein like reference characters refer to the same parts throughout the several views and in which.

Figures 1, 3, 5, 7:
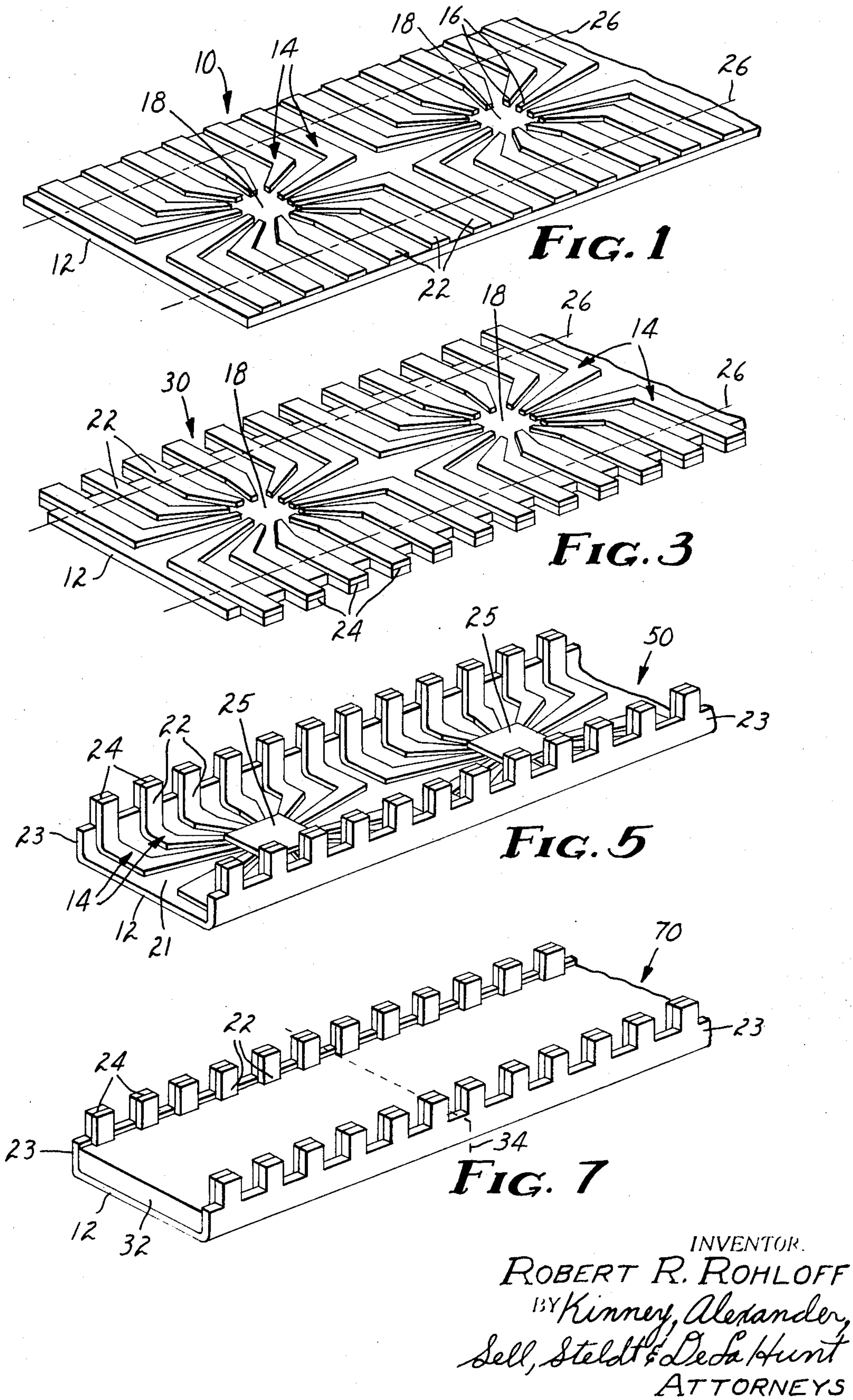
FIGS. 1, 2, 3 and 4 are perspective views of patterned circuitry useful as precursors in the formation of packaging devices of the invention.
FIG. 5 is a perspective view of a packaging device of the invention.
FIG. 7 shows a packaging device after encapsulation of semiconductor devices.

In FIG. 1–4 there are shown continuous lengths of precursor materials 10, 20, 30 and 40 which are useful in making the packaging devices of the invention. Each of precursor materials 10, 20, 30 and 40 comprises a self-supporting dielectric substrate 12 having a plurality of conductive land areas 14 thereon in a predetermined, repeating pattern. The conductive land areas 14 are spaced apart from one another and have inner ends 16 which converge to a common area 18 of the substrate 12 so as to define a site where a semiconductor device may be later electrically received. For example, a semiconductor device may be mounted or placed on the substrate in area 18 and then electrically connected to ends 16 with tiny wires, or a semiconductor device may be superimposed in registry over ends 16 and then flip-chip bonded directly to ends 16. To facilitate flip-chip bonding, metal bumps 17 can be provided on ends 16 of land areas 14.

Figures 2, 6, 9:
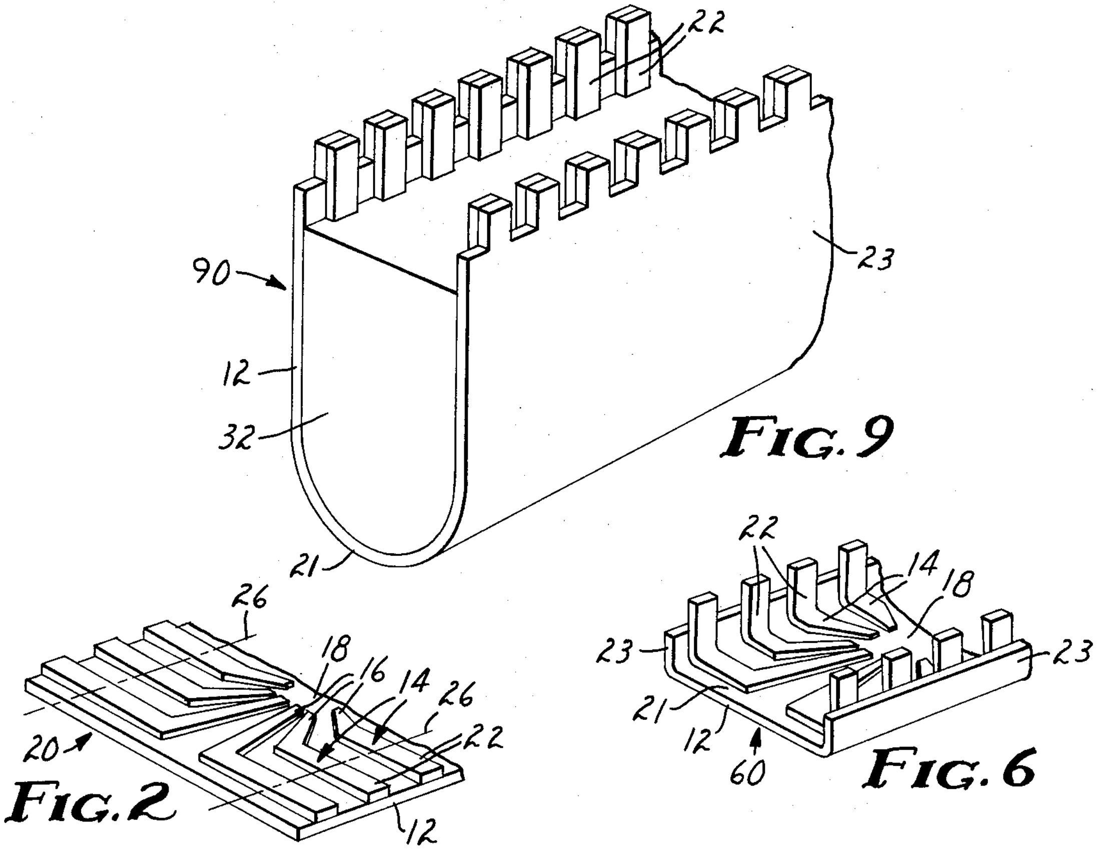
FIG. 6 is a perspective view of another packaging device of the invention.
FIG. 9 is a finished packaging device made from the precursor of FIG. 8.
Figure 4:
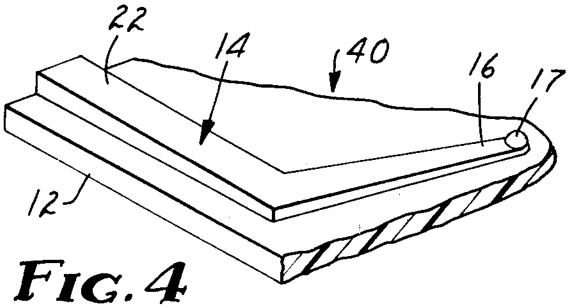

Conductive land areas 14 extend outward from ends 16 in the form of a plurality of fingers 22. Substrate 12 may be, if desired, stamped or punched out away from adjacent fingers 22 in order to leave extending tips or leads 24. It is also possible for fingers 22 to extend beyond the edge of the substrate, as shown in FIG. 6. In order to provide more rigid tips or leads, land areas 14 may increase in thickness as they extend outward into fingers 22, as shown in FIGS. 2 and 4.

Packaging devices of the invention can be formed from the precursors of FIGS. 1–4 by bending or folding substrate 12 across fingers 22 along dotted lines 26 to form a channel having a base 21 and side walls 23. Thus, packaging device 50 in FIG. 5 was very conveniently formed from the precursor 30 of FIG. 3 by bending. Semiconductor chip 25 has been flip-chip bonded to ends 16 of land areas 14. Packaging device 60 of FIG. 6 may also be formed by bending the substrate on which land areas 14 lie.

Similar packaging devices may be made by placing conductive land areas onto an already formed channel shaped substrate. However, it has been found that the easiest manner of making the novel devices is by folding precursor printed circuit material of the types shown in FIGS. 1–4 into channel shapes.

The packaging devices which are provided in continuous strip form may be convolutely wound into a roll for convenient handling and transporting when the semiconductor devices are to be attached later at another location.

The shape of the channel defined by substrate 12 is not important in theory as long as it is sufficiently deep to allow the semiconductor to be completely covered with encapsulant material poured therein. In FIG. 7 there is shown a packaging device 70 wherein encapsulating resin 32 has been poured into the channel defined by the folded substrate 12 and cured. Thus, the semiconductor chips which were bonded to the conductive land areas are completely covered and hermetically sealed by the resin 32. Tips 24 of fingers 22 extend above the surface of the encapsulating resin and are thereby exposed as leads for connection to further electrical circuitry, e.g., to a printed circuit board. Individual packages may be separated from the continuous strip by severing along dotted line 34.

Figure 8:
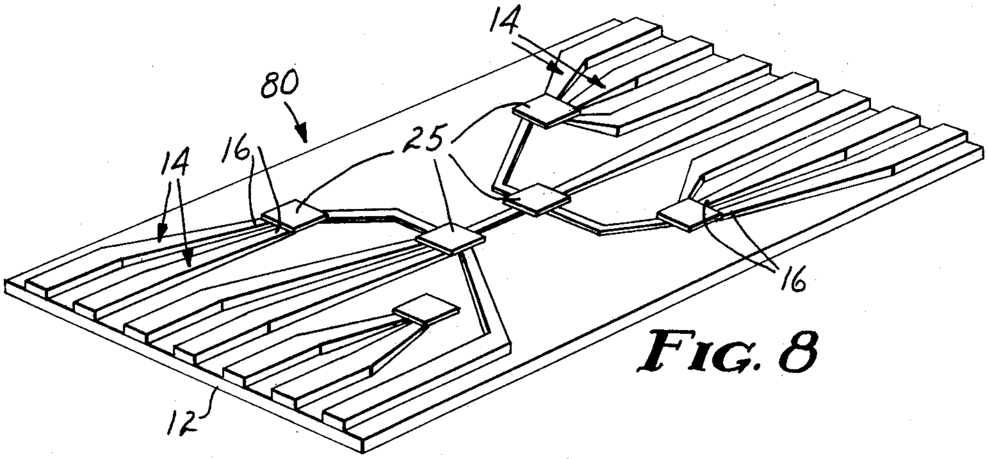
FIG. 8 is another type of circuitry useful as a precursor in the practice of the invention.

In FIG. 8 there is shown a packaging device precursor 80 which comprises a dielectric substrate 12 and a predetermined pattern of a plurality of conductive land areas 14. Land areas 14 are so arranged that they define a plurality of sites at which a semiconductor device may be electrically received, e.g., through flip-chip or wire bonding. A plurality of semiconductor chips 25 are shown in bonded relationship with ends 16 of land areas 14. Land areas 14 extend outward from ends 16 and chips 25 in the form of extending fingers 22. Optionally, substrate 12 may be stamped or punched out from between adjacent fingers 22 to leave extending feet.

The novel packaging device 90 in FIG. 9 may be formed by forming precursor 80 of FIG. 8 into a channel having side walls 23 and a rounded base 21. The chips 25 are then located within the channel. Fingers 22 extend along and beyond the side walls of the channel and are thereby exposed as leads for connection to further electrical circuitry. Packaging device 90 has been filled with encapsulating resin 32 to completely cover and hermetically seal chips 25.

The packaging devices of the invention may also have additional metal coatings on the outer surfaces of the channel. Such metal coatings serve a variety of purposes, e.g. (1) to lower the moisture vapor transmission rate through the substrate, (2) to increase the rigidity of the extending feet or leads, and (3) to facilitate anchorage of the extending feet or leads to a printed circuit board by increasing the solderable surface area of the extending feet.

Dielectric substrates 12 useful for the packaging devices of the invention are self-supporting thermoplastic or thermosetting films having a thickness in the range of 0.25–25 mils (0.006 to 0.6 mm.), although a thickness in the range of 5–20 mils (0.13 to 0.51 mm.) is preferred. Typical useful substrates are films of polyphenylene oxide, polyester, fluorocarbon, acrylic, polysulfone, polyimide, polyamide, polyolefin, styrene and glass fiber reinforced thermoplastics. Preferably the substrate exhibits a relatively high heat distortion temperature, i.e., 300° F., at 66 p.s.i., and a low moisture vapor transmission rate.

The conductive land areas 14 are preferably metals such as aluminum, copper, nickel, silver, gold and the like. Alloys of these metals, either with each other or with other metals such as iron or cobalt, are also very useful. Bimetal strips, e.g., solder plated aluminum or gold plated nickel, have also been useful. The thickness of the conductive land areas must be at least sufficient to allow electrical conductivity and they may be quite thick, e.g., 5 to 10 mils, although a 1.0 mil (0.025 mm.) thickness is generally preferred for economic reasons. The conductive land areas are ordinarily provided by conventional photo etching techniques of metal coated dielectrics, although it is possible to adhesive bond metal strips to a desired dielectric strip or tape.

Encapsulating resins useful for covering and hermetically sealing the semiconductor chips in the packaging device of the invention are any of those which adhere well to the semiconductor chip and the conductive land areas and which do not allow significant moisture vapor transmission therethrough. The encapsulating resin may be, for example, a powdered resin, a 1-part liquid curable, a 2-part liquid curable, a monomeric, cross-linkable resin, or a hot melt system. Particularly useful encapsulants are epoxies, silicones and polyurethanes. The encapsulant should be free of mold release agents because such chemicals may allow moisture leakage paths to develop along the conductive land areas and they may interact with the semiconductor chip itself.

What is claimed is:

1. A packaging device for the housing of semiconductor devices to facilitate handling, testing and later attachment thereof to further electrical circuitry, the packaging device comprising a self-supporting, resilient, deformable dielectric substrate in the form of a channel having a base and side walls, said channel having a predetermined pattern of a plurality of conductive land areas therewithin, said land areas defining at least one site within said channel, said site being adapted to electrically receive a semiconductor device, and said land areas extending outward from said site in the form of a plurality of fingers, said fingers being continuous and extending upwardly along the side walls of said channel, wherein said fingers are exposed for later attachment thereof to further electrical circuitry.

2. A packaging device in accordance with claim 1, wherein said fingers extend upwardly beyond the edges of the side walls of said channel.

3. A plurality of packaging devices in continuous strip form for the housing of semiconductor devices to facilitate handling, testing, and later attachment thereof to further electrical circuitry, comprising a continuous self-supporting, resilient, deformable dielectric substrate in the form of a channel having a base and sidewalls, said channel having longitudinally-spaced therewithin predetermined repeating patterns of a plurality of conductive land areas, the land areas of each said pattern defining at least one site within said channel, said site being adapted to electrically receive a semiconductor device and said land areas extending outward from said site in the form of a plurality of fingers, said fingers being continuous and extending upwardly along the sidewalls of said channel and adapted for attachment thereof to further electrical circuitry.

4. A convolutely wound roll comprising the plurality of packaging devices in strip form of claim 3.

5. A packaging device for the housing of semiconductor devices to facilitate handling, testing and later attachment thereof to further electrical circuitry, the packaging device comprising a self-supporting, resilient, deformable, dielectric substrate in the form of a channel having a base and side walls, the top edges of said side walls having a plurality of notches therein defining tabs therebetween, said channel having a predetermined pattern of a plurality of conductive land areas therewithin, said land areas defining at least one site within said channel, said site being adapted to electrically receive a semiconductor device, and said land areas extending outward from said site in the form of a plurality of fingers, said fingers being continuous and extending upwardly along the side walls of said channel forming leads, wherein the spaces between adjacent leads coincide with the notches in the top edges of said side walls and said leads extend onto said tabs.

6. A packaging device in accordance with claim 5, wherein a semiconductor device is electrically connected to said plurality of conductive land areas.

7. A packaging device in accordance with claim 6, wherein said channel contains encapsulant covering said semiconductor device.

8. A plurality of packaging devices in continuous strip form for the housing of semiconductor devices to facilitate handling, testing, and later attachment thereof to further electrical circuitry, comprising a continuous self-supporting, resilient, deformable dielectric substrate in the form of a channel having a base and side walls, the top edges of said side walls having a plurality of notches therein defining tabs therebetween, said channel having longitudinally spaced therewithin predetermined repeating patterns of a plurality of conductive land areas, the land areas of each said pattern defining at least one site within said channel, said site being adapted to electrically receive a semiconductor device and said land areas extending outward from said site in the form of a plurality of fingers, said fingers being continuous and extending upwardly along the sidewalls of said channel forming leads, wherein the spaces between adjacent leads coincide with the notches in the top edges of said side walls and said leads extend onto said tabs.

* * * * *